US006525972B2

(12) United States Patent
Yanagisawa

(10) Patent No.: US 6,525,972 B2
(45) Date of Patent: Feb. 25, 2003

(54) SEMICONDUCTOR MEMORY DEVICE WITH BOOSTING CONTROL CIRCUIT AND CONTROL METHOD

(75) Inventor: Takeshi Yanagisawa, Tokyo (JP)

(73) Assignee: NEC Corporation, Tokyo (JP)

( * ) Notice: Subject to any disclaimer, the term of this patent is extended or adjusted under 35 U.S.C. 154(b) by 23 days.

(21) Appl. No.: 09/899,779

(22) Filed: Jul. 5, 2001

(65) Prior Publication Data

US 2001/0050878 A1 Dec. 13, 2001

(30) Foreign Application Priority Data

Jul. 6, 2000 (JP) ....................................... 2000-205749

(51) Int. Cl.[7] ............................................ G11C 11/4063

(52) U.S. Cl. .................. 365/189.09; 365/228; 365/226; 365/233.5; 365/230.06; 365/189.07; 365/195; 327/534; 327/536; 327/537

(58) Field of Search ....................... 365/189.09, 230.06, 365/228, 226, 233.5, 194, 195, 191, 189.07; 326/88; 327/536, 537, 534, 530

(56) References Cited

U.S. PATENT DOCUMENTS 5,253,204 A * 10/1993 Hatakeyama et al. .. 365/189.06
5,666,313 A * 9/1997 Ichiguchi .................... 365/195
5,708,373 A * 1/1998 Inoue .......................... 326/88
5,815,446 A * 9/1998 Tobita ................... 365/189.09
6,069,518 A * 5/2000 Nakai et al. ................ 327/535

FOREIGN PATENT DOCUMENTS

JP 5-151773 6/1993 ......... G11C/11/407

* cited by examiner

*Primary Examiner*—Andrew Q. Tran
(74) *Attorney, Agent, or Firm*—Darryl G. Walker; Bradley T. Sako

(57) ABSTRACT

A semiconductor memory device (50) having a boosted potential generation circuit is provided. The boosted potential generation circuit may provide charge to a boosted potential node when a word line (11) is to be activated. The boosted potential generation circuit may include a boosting control circuit (5), a boosted potential detection circuit (6), an oscillator circuit (7), and a booster circuit (8). The boosting control circuit (5) may generate a boosting control signal when a command decoder (1) indicates that a word line may be activated. In response to the boosting control signal, the boosted potential detection circuit (6) may enable the oscillator circuit (7) so that booster circuit (8) may transfer charge to the boosted potential node. This may allow the boosted potential node to have adequate charge that may be provided to the word line when activated.

20 Claims, 8 Drawing Sheets

7
7a
7b
7c
7d
VBOS
IV17
IV16
IV15
N4
G1
N3
Tr61
Tr62
Tr63
Tr64
Tr65
Tr66
VBUP
Vref
Vint
IV11
IV12
IV13
IV14
Tr11
Tr12
Tr13
Tr14
Tr15
Tr16
Tr17
Tr18
Tr19
Tr20
Tr21
Tr22
Tr23
Tr24
Tr25
Tr26
Tr27
Tr28
Tr29
Tr30
Tr31
Tr32
Tr33
Tr34
Tr35
Tr36
Tr37
Tr41
Tr42
Tr43
Tr44
Tr45
Tr46
Tr47
Tr48
Tr49
Tr50
Tr51
Tr52
Tr53
Tr54
Tr55
Tr56
Tr57
Tr58
Tr59
T60

SEMICONDUCTOR MEMORY DEVICE WITH BOOSTING CONTROL CIRCUIT AND CONTROL METHOD

TECHNICAL FIELD

The present invention relates generally to semiconductor devices and more particularly to a semiconductor memory device having a control method that may suppress a potential reduction of a word line potential power supply upon word line selection.

BACKGROUND OF THE INVENTION

A semiconductor memory device, such as a dynamic random access memory (DRAM), can have a memory cell formed by a memory cell transistor and a memory cell capacitor. The memory cell transistor is typically an n-type insulated gate field effect transistor (IGFET). The control gate of the memory cell transistor is connected to a word line, one source/drain terminal is connected to a bit line, and another source/drain terminal is connected to the memory cell capacitor. The memory cell capacitor stores charge indicative of the logic level of the bit stored in the memory cell. Because the potential of the source of an n-type IGFET is limited to a threshold voltage (Vt) below the potential applied to the gate of the n-type IGFET, the potential held on the memory cell capacitor is limited. In the case where a power supply voltage Vint is the maximum potential applied to a word line, the memory cell capacitor has a maximum potential of Vint−Vt, where Vt is the threshold voltage of the memory cell transistor. Thus, even if a data potential corresponding to the power supply Vint is applied to the bit line, a potential of Vint−Vt is stored on the memory cell capacitor. This can effect data integrity and/or refresh specifications.

To prevent the above-mentioned problem, the word line is typically supplied with a potential higher than the power supply voltage Vint. The potential higher than the power supply voltage Vint may be considered a word line activation potential. The word line activation potential can be the potential necessary to provide adequate charge transfer to and from the memory cell capacitor.

There are two approaches for obtaining a voltage higher than the power supply voltage Vint.

One approach uses an oscillator connected to a multiplying charge pump rectifier. The approach can constantly supply a boosted voltage.

Another approach is to use a bootstrapping capacitor, such that a bootstrapping pulse can be laid over a word line supplying potential.

Referring to FIG. 9, a block schematic diagram of a conventional DRAM is set forth and given the general reference character 100.

Conventional DRAM 100 includes a command decoder 101, which decodes a command received from a central processing unit (CPU) and provides a control signal to row control circuit 104. Also included is an address buffer 102 which receives an address signal and provides a row address to a word selection circuit 103 and a column address to a bit selection circuit 109. Command decoder 101 provides a row enable signal RE to the address buffer 102 and word selection circuit 103.

Conventional DRAM 100 includes an array of memory cells 110. Memory cells (for example, memory cell 113) are formed at the intersection of a bit line (for example, bit line 112) and a word line (for example, word line 111). Word selection circuit receives a boosted voltage VPP from a booster circuit 108 and based on the address value receive from address buffer 102 selects a word line 111 when the row enable signal RE becomes active. Boosted voltage VPP is applied to a selected word line 111.

A boosted potential detection circuit 106 receives the boosted potential VPP and detects whether or not boosted potential VPP falls below a predetermined potential. Boosted potential detection circuit 106 provides a boosted voltage signal VBUP to an oscillator circuit 107 and booster circuit 108. Oscillator circuit 107 provides an oscillation signal VBOS to the booster circuit 108.

Sense amplifier 114 detects a data signal on a row of selected memory cells (for example, memory cells connected to selected word line 111). Bit selection circuit 109 then selects a column (for example bit line 112) based on a column address received from address buffer 102. Thus, data is provided to or from the conventional DRAM 100 by way of input/output (I/O) buffer 115.

Referring now to FIG. 10, a circuit schematic diagram of boosted potential detection circuit 106 is set forth. Boosted potential detection circuit 106 is the boosted potential detection circuit 106 of FIG. 9.

Boosted potential detection circuit 106 has resistor devices (R101*a* and R101*b*) connected in series between boosted potential VPP and ground GND. Boosted potential VPP is connected to one terminal of resistor device R101*a*. One terminal of resistor device R101*b* is connected to ground GND. The other terminals of resistor devices (R101*a* and R101*b*) are connected to provide a potential to one input terminal of comparator circuit COM101. A reference potential Vs is supplied to the other input terminal of comparator circuit COM101. The boosted voltage signal VBUP is output from comparator COM101. The resistance values of resistor devices (R101*a* and R101*b*) are determined based on the values of the desired boosted potential VPP and reference potential Vs, so that when boosted potential is at a desired potential, a potential obtained at the connection point of resistor devices (R101*a* and R101*b*) is equal to the reference voltage Vs.

Referring now to FIG. 11, a circuit schematic diagram of oscillator circuit 107 is set forth. Oscillator circuit 107 is oscillator circuit 107 of FIG. 9.

Oscillator circuit 107 has a NAND gate NAND110 and inverters (IV111 to IV115). NAND gate NAND110 and inverters (IV111 to IV114) are connected in series to form a ring oscillator circuit with the output of inverter IV114 connected to an input of NAND NAND110. NAND gate NAND110 also receives boosted voltage signal VBUP at an input. Inverter IV115 is connected to receive the output of inverter IV114 as an input and provides the oscillation signal VBOS as an output.

When boosted voltage signal VBUP is at a high logic level, oscillator circuit 107 oscillates and the oscillation signal VBOS periodically changes logic level. However, when boosted voltage signal VBUP is at a low logic level, oscillator circuit 107 stops oscillating and the oscillation signal VBOS is maintained at a predetermined logic level (logic low).

Referring now to FIG. 13, a schematic diagram of booster circuit 108 is set forth. Booster circuit 108 is booster circuit 108 of FIG. 9.

Booster circuit 108 has transistors (Tr111 and Tr112), inverter IV116, boosting capacitor Cc and smoothing capacitor Cd. Power supply voltage Vint is connected to the gate and source of transistor Tr111. A drain of transistor Tr111 is connected to node a. Inverter IV116 receives oscillation signal VBOS as an input and provides an output to a terminal of boosting capacitor Cc at node b. Another terminal of boosting capacitor Cc is connected to node a. Transistor Tr112 has a source and gate connected to node a and a drain connected to smoothing capacitor Cd at node c. Boosted potential VPP is output at node c. Another terminal of smoothing capacitor Cd is connected to ground potential.

The operation of booster circuit 108 will now be described.

When the oscillation signal VBOS is at a logic high, node b is at a low potential. Node a is then precharged through transistor Tr111 to a potential of power supply voltage Vint minus Vt (a threshold voltage of transistor Tr111). When oscillation signal VBOS transitions to a logic low, node b transitions to a high potential (Vint). Node a is then boosted to 2Vint minus Vt. Diode configured transistor Tr112 then conducts and transfers charge from boosting capacitor Cc to smoothing capacitor Cd. Oscillation signal VBOS continues to oscillate and boosted potential VPP has a theoretical limit of (2Vint−2Vt), where 2Vt is the combined threshold voltages of transistors (Tr111 and Tr112).

The boosted potential VPP can be increased by increasing the number of stages of transistor Tr112 and boosting capacitor Cc.

Referring now to FIG. 12, a timing diagram illustrating a boosting operation in the conventional DRAM 100 is set forth.

Referring to FIG. 12 in conjunction with FIG. 9, in conventional DRAM 100, when a command is input into command decoder 101, command decoder 101 decodes the command. If the command is a data read, data write, or refresh command, the command decoder outputs a control signal ACT/REF as a one-shot signal to the row control circuit 104. Row control circuit 104 outputs a row enable signal RE to activate the address buffer 102 and word selection circuit 103. During the time that the command is input into command decoder 101 an address signal is also input into address buffer 102. The address buffer 102 transmits the address to the word selection circuit 103 in synchronization with the rise of the row enable signal RE.

Referring now to FIG. 10, in the boosted potential detection circuit 106, the boosted potential VPP is input into one terminal of resistor device R101*a*. Resistance values of resistors (R110*a* and R101*b*) are chosen so that the potential at the connection node between the resistor devices (R101*a* and R101*b*) is VPP/2. Comparator COM101 compares the potential VPP/2 with the reference potential Vs. The reference potential Vs is set at 2.0V. When the potential VPP/2 is higher than the reference potential Vs (e.g. 2.0 V), boosted voltage signal VBUP is logic low. However, when the boosted potential VPP drops such that the potential VPP/2 falls below the reference potential Vs, boosted voltage signal VBUP is logic high. This indicates that the boosted potential VPP has fallen below the desired minimum potential of 4.0 V.

Referring again to FIG. 12, at a time before the command has been entered, it can be seen that boosted potential VPP falls below the minimum potential of 4.0V. Then, boosted voltage signal VBUP becomes logic high. Referring now to FIG. 11, oscillator circuit 107 receives the logic high boosted voltage signal VBUP. Oscillator circuit 107 is thus enabled. Thus, a time delay Δt1 after boosted potential VPP dips below the minimum potential (4.0V), oscillation signal VBOS begins to oscillate and booster circuit 108 begins to boost the boosted potential VPP. The time delay Δt1 is determined by the propagation delays of boosted potential detection circuit 106 and oscillation circuit 107.

After the command is received by command decoder 101, if the command is a data read, data write, or refresh command, the command decoder 101 outputs a control signal ACT/REF as a one-shot signal to the row control circuit 104. Row control circuit 104 outputs a row enable signal RE to activate the address buffer 102 and word selection circuit 103. During the time that the command is input into command decoder 101 an address signal is also input into address buffer 102. The address buffer 102 transmits the address to the word selection circuit 103 in synchronization with the rise of the row enable signal RE.

When word selection circuit 103 receives the active row enable signal RE, word selection circuit 103 electrically connects boosted power potential VPP to a word line (for example word line 111). A word line 111 is connected to a large number of memory cells. Thus, a word line has a relatively large word line capacitance Cw. This causes boosted power potential VPP to instantaneously drop, as illustrated in FIG. 12.

Accordingly, boosted potential detection circuit 106 outputs a logic high boosted voltage signal VBUP. A time delay Δt2 after the boosted potential VPP drops, oscillator circuit 107 begins to oscillate and provide an oscillating oscillation signal VBOS. Booster circuit 108 then begins to boost the boosted potential VPP. Thus, it can be seen that boosted potential VPP does not begin to recover until a time delay Δt2 after the boosted potential VPP drops. When boosted potential VPP becomes higher than 4.0V, the boosted voltage signal VBUP returns low and the oscillator circuit 107 and booster circuit 108 are disabled.

In recent years, the capacity of DRAMs continue to increase. As a result, the number of memory cells selected in one activation operation increases. Thus, a larger number of memory cells are provided with a boosted potential VPP on the control gates of the memory cell transistors. This increases the capacitance Cw loading the boosted potential VPP when memory cells are selected.

When a word line is selected, charge on smoothing capacitor Cd is transferred to the selected word line. This charge transfer causes the boosted potential VPP to drop as determined by the capacitance ratios between smoothing capacitor Cd and word line capacitance Cw as well as their respective potentials. Because of the time delay Δt2 before the boosted potential VPP begins to recover, a sufficient boosted voltage VPP can not be instantaneously obtained. When boosted voltage VPP becomes lower, the word line potential Vw recovers slowly to a proper level. This can effect the operating speed of the DRAM.

The voltage drop of boosted potential VPP can be decreased by increasing the capacitance value of smoothing capacitor Cd. However, this increases chip size, which in turn increases production costs.

An example of the second boosting method is illustrated in Japanese published Unexamined Patent Application No. Hei 5151773.

The second boosting method includes detecting the application of the Row Address Strobe (RASB) signal and temporarily boosting a potential RX supplied to the word line driver. However, because boosting is made temporarily utilizing a pulse, the boosted voltage level can vary greatly. Various factors can cause the fluctuation in the potential RX. Such factors include variations of: transistor characteristics, wiring resistances, parasitic capacitance, power supply voltages and temperatures, as just a few examples.

If the boosted voltage level (potential RX) is too high, stress on the memory cell can cause the cell transistor to degrade and the life of the semiconductor memory device is shortened. Alternatively, if the boosted voltage level is too low, a sufficient amount of charge cannot be supplied to the memory cell capacitor. Thus, data integrity becomes degraded and insufficient charge may be available for a read operation or the read operation may be delayed because it may take the sense amplifier longer to properly sense the differential voltage on a bit line pair. Also, the data in the memory cell will more rapidly degrade over time and the refresh period must be shortened.

Also, if the parasitic capacitance of the word line increases, a predetermined boosted voltage level cannot be achieved without increasing the boosting capacitance. The increased boosting capacitance must be driven by a large transistor. As a result of these factors, the chip size of the semiconductor memory device increases. Also, continuously charging and discharging large capacitors can create on-chip noise which can effect operations such as reading.

In view of the above discussion, it would be desirable to provide a semiconductor memory device having a control method capable of raising a word line potential without adversely affecting chip size. It would also be desirable to suppress the potential drop of a boosted potential when selecting a word line. It would also be desirable to reduce the time required to begin restoring the boosted potential and improve reading and writing speeds. It would also be desirable to reduce the occurrence of noise that may be generated from providing a boosted potential.

SUMMARY OF THE INVENTION

According to the present embodiments, a semiconductor memory device having boosted potential generation circuit is provided. The boosted potential generation circuit may provide charge to a boosted potential node when a word line is to be activated. The boosted potential generation circuit may include a boosting control circuit, a boosted potential detection circuit, an oscillator circuit, and a booster circuit. The boosting control circuit may generate a boosting control signal when a command decoder indicates that a word line may be activated. In response to the boosting control signal, the boosted potential detection circuit may enable the oscillator circuit so that the booster circuit may transfer charge to the boosted potential node. This may allow the boosted potential node to have adequate charge that may be provided to the word line when activated.

According to one aspect of the embodiments, a memory cell array may have a plurality of word lines and a word selection circuit may activate one of the plurality of word lines based on the value of an address. The boosted potential node may provide charge to the activated word line.

According to another aspect of the embodiments, the boosted potential generation circuit may detect a command to activate a word line and may provide charge to the boosted potential node before the word line is activated.

According to another aspect of the embodiments, the command to activate a word line may be a read, write or refresh command.

According to another aspect of the embodiments, a booster circuit may provide charge to the boosted potential node in response to an oscillation signal.

According to another aspect of the embodiments, a boosting control circuit may provide a one-shot boosting control signal indicating that a word line is to be activated.

According to another aspect of the embodiments, a boosted potential detection circuit may receive the boosting control signal and may provide a boosted voltage signal having an oscillator enable state and an oscillator disable state. The boosted voltage signal may have the oscillator enable state when the boosting control signal indicates that the word line is to be activated.

According to another aspect of the embodiments, the boosted voltage signal may have the oscillator enable state when the boosted potential node falls below a predetermined potential.

According to another aspect of the embodiments, the boosted voltage signal may have the oscillator enable state when the boosted potential is lower than a first predetermined potential when the boosting control signal does not indicate that the word line is to be activated. The boosted voltage signal may have the oscillator enable state when the boosted potential is lower than a second predetermined potential when the boosting control signal indicates that the word line is to be activated. The second predetermined potential may be greater than the first predetermined potential.

According to another aspect of the embodiments, the oscillator circuit may include an oscillating signal generator and an oscillator preset circuit. The oscillating signal generator may oscillate when the boosted voltage signal is in the oscillator enable state and the oscillator preset circuit may preset the oscillating signal generator to an opposite start state when the boosted voltage signal is in the oscillator disable state.

According to another aspect of the embodiments, an oscillation circuit may be coupled to generate an oscillation signal that may have periodic logic transitions when the boosted voltage signal is in the oscillator enable state. A booster circuit may be coupled to provide charge to the boosted potential node in response to logic transitions in the oscillation signal.

According to another aspect of the embodiments, a boosting control circuit may generate a boosting control signal in response to a control signal indicating that a word line is to be activated. The boosting control signal may be a one-shot pulse and a command decoder may receive an externally applied command and generate the control signal.

According to another aspect of the embodiments, the boosted potential detection circuit may include a comparator that can compare a reference potential and a boosted level indicating potential and may generate a boosted voltage signal having an oscillator enable state when the reference potential is greater than the boosted level indicating potential.

According to another aspect of the embodiments, the boosted potential detection circuit may generate the boosting control signal having a first boosting control logic state when a word line is to be enabled. The boosted potential detection circuit may generate the boosted voltage signal having the oscillator enable state when the boosting control signal has the first boosting control logic state.

According to another aspect of the embodiments, the boosted potential detection circuit may include a voltage divider circuit that may receive a boosted potential and provide a potential that is proportional to the boosted potential. A comparator may compare the proportional to the boosted potential and provide the boosted voltage signal based on the comparison.

According to another aspect of the embodiments, the boosted potential detection circuit may include first and second voltage divider circuits that may be selectable according to the logic value of the boosting control signal.

This may enable the boosted potential node to have a higher potential when a word line is to be selected.

According to another aspect of the embodiments, a control method for controlling a semiconductor memory device having a booster circuit that may generate a boosted potential in response to an oscillation signal that may be generated by an oscillator circuit may include the following steps: receiving a command and an address, decoding the command, generating a boosting control signal in response to the decoded command indicating that a word line is to be activated, providing charge to a boosted potential node in response to the boosting control signal, providing an electrical connection between the boosted potential node and the word line in accordance with the value of the address received.

According to another aspect of the embodiments, the step of providing charge to the boosted potential node may provide a boosted potential greater than an activation potential of the word line.

According to another aspect of the embodiments, the step of generating a boosted control signal may include generating the boosted control signal having a one-shot pulse.

According to another aspect of the embodiments, the step of providing charge to a boosted node includes generating the oscillation signal having an oscillation signal period between logical transitions. The oscillation signal may be generated in response to the boosting control signal.

According to another aspect of the embodiments, generating the oscillation signal in response to the boosting control signal may include generating an oscillation control signal in response to the boosting control signal. The oscillation signal may have a last oscillation state when the oscillation control signal is in an oscillation disable state and the oscillation signal may transition to an opposite to last oscillation state when the control signal transitions to an oscillation enable state without being delayed by the oscillation signal period between transitions.

DETAILED DESCRIPTION OF THE EMBODIMENTS

Various embodiments of the present invention will now be described in detail with reference to a number of drawings.

Figure 1:
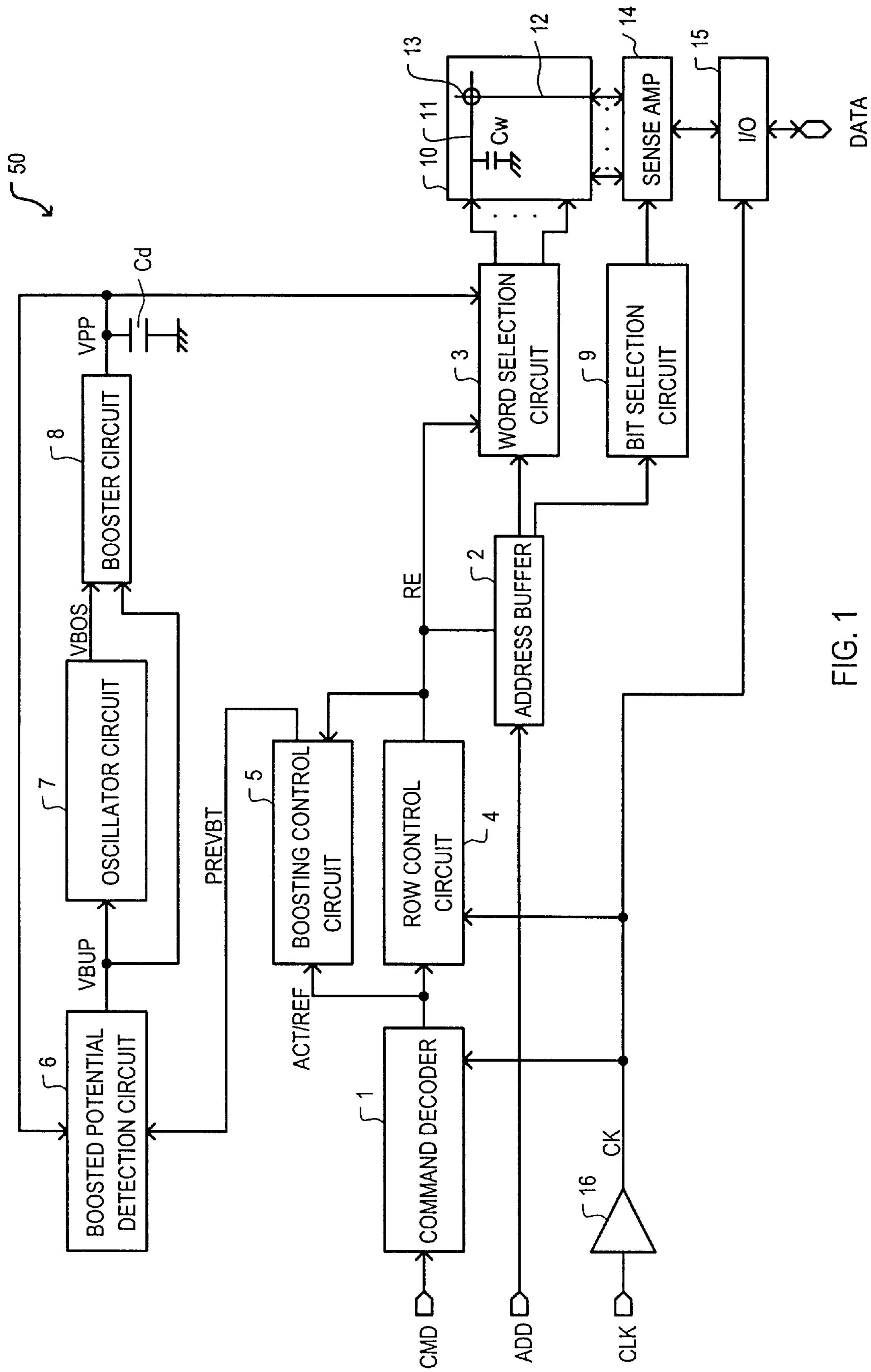
FIG. 1 is a block schematic diagram of a semiconductor memory device according to one embodiment.

Referring now to FIG. 1, a semiconductor memory device according to one embodiment is set forth in a block schematic diagram and given the general reference character 50. It is understood that semiconductor memory device 50 illustrated in FIG. 1 may only show portions that may be relevant in discussing the present invention.

Semiconductor memory device 50 may include a command decoder 1 which may receive a command CMD from an external device, such as a central processing unit (CPU). Command CMD may be input in synchronization with a clock signal CK. Clock signal CK may be generated by a clock buffer 16. Clock buffer 16 may receive an external clock CLK and may generate clock signal CK. Command CMD may be decoded by command decoder 1 in synchronization with clock signal CK. When a command CMD requires a word line to be activated, command decoder 1 may activate a control signal ACT/REF. Control signal ACT/REF may indicate that an activate command or a refresh command has been received, as just two examples. A row control circuit 4 may receive control signal ACT/REF and may generate a row enable signal RE. A boosting control circuit 5 may receive control signal ACT/REF and row enable signal RE and may generate a boosting control signal PREVBT. Boosting control signal PREVBT may be a pulse having a predetermined delay from the activated control signal ACT/REF. Boosting control signal PREVBT may be a one-shot pulse having a predetermined pulse width.

A boosted potential detection circuit 6 may receive boosting control signal PREVBT and a boosted potential VPP as an input and may generate a boosted voltage signal VBUP. Boosted voltage signal VBUP may have an enabled state when either boosting control signal PREVBT is active or boosted potential VPP is below a predetermined potential. An oscillator circuit 7 may receive boosted voltage signal VBUP and may generate an oscillation signal VBOS. A booster circuit 8 may receive oscillation signal VBOS and boosted voltage signal VBUP and may generate boosted potential VPP. A smoothing capacitor Cd may receive boosted potential VPP. Smoothing capacitor Cd may be used to provide instantaneous charge to circuitry that may use boosted potential VPP as a power supply. In this way, voltage spikes may be reduced on boosted potential VPP.

Semiconductor memory device 50 may also include an address buffer 2. Address buffer 2 may receive an address signal ADD and may provide a row address to a word selection circuit 3 and/or a column address to a bit selection circuit 9. A memory array 10 may include word lines (for example, word line 11), bit lines (for example, bit line 12), and memory cells (for example, memory cell 13) which may be formed at the intersection of word lines and bit lines. In this way, memory array 10 may include an array of memory cells (such as, memory cell 13).

Word selection circuit 3 may receive row enable signal RE, row address (from address buffer 2), and boosted potential VPP and may activate a word line (for example, word line 11) based on the value of the received row address. In this way, word selection circuit 3 may provide boosted potential VPP to a predetermined word line (for example, word line 11).

A sense amplifier 14 may receive bit lines (such as bit line 12) and may amplify small signals received. In this way, data from a row of memory cells (such as memory cell 13) may be sensed. Bit selection circuit 9 may select a predetermined bit or group of bits based on a column address (from address buffer 2). An input/output (I/O) buffer 15 may provide data DATA between sense amplifier 14 and external terminals. In this way, data DATA may be read from or written to memory array 10 in synchronization with clock signal CK.

Figure 2:
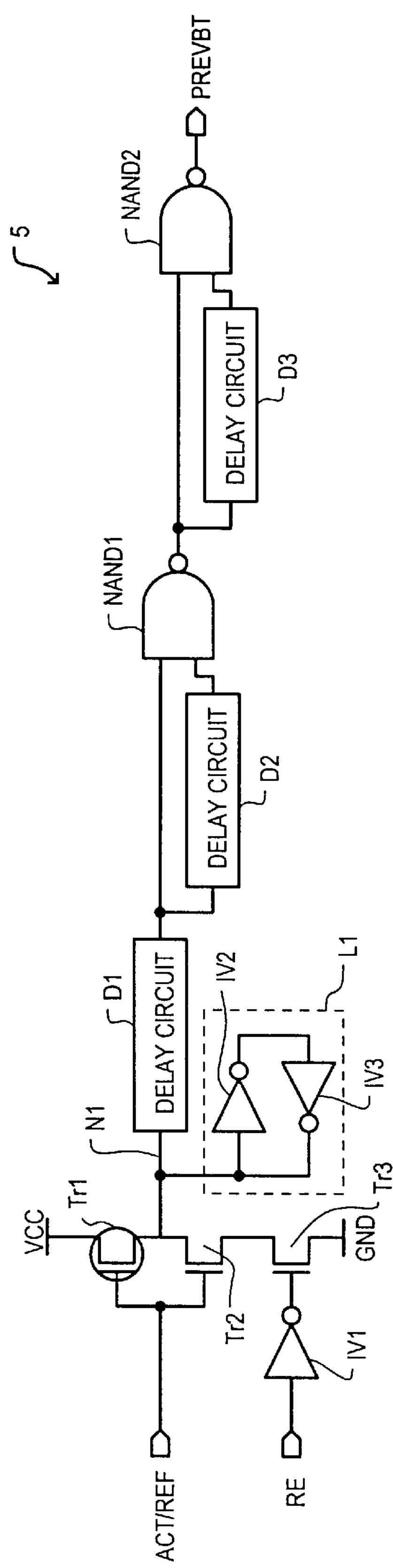
FIG. 2 is a circuit schematic diagram of a boosting control circuit according to one embodiment.

Referring now to FIG. 2, a circuit schematic diagram of boosting control circuit 5 according to one embodiment is set forth. Boosting control circuit 5 can be boosting control circuit 5 in semiconductor memory device 50 illustrated in FIG. 1.

Boosting control circuit 5 may receive control signal ACT/REF and row enable signal RE and may generate boosting control signal PREVBT. Boosting control circuit 5 may include an inverter IV1, transistors (Tr1 to Tr3), delay circuits (D1 to D3), NAND gates (NAND1 and NAND2) and a latch circuit L1.

Inverter IV1 may receive row enable signal RE at an input and may have an output connected to a gate of transistor Tr3. Transistor Tr3 may have a source connected to ground potential GND and a drain connected to a source of transistor Tr2. Transistor Tr2 may have a gate connected to receive control signal ACT/REF and a drain connected to a node N1. Transistor Tr1 may have a gate connected to receive control signal ACT/REF, a source connected to power supply VCC, and a drain connected to node N1. Transistors (Tr2 and Tr3) may be n-type insulated gate field effect transistors (IGFETs). Transistor Tr1 may be a p-type IGFET.

Latch circuit L1 may have an input connected to node N1. Latch circuit can include inverters (IV2 and IV3). Inverter IV2 may have an input connected to node N1 and an output connected to an input of inverter IV3. Inverter IV3 may have an output connected to node N1. In this way, latch circuit L1 may keep node N1 from floating.

Delay circuit D1 may have an input connected to node N1 and an output connected to an input of NAND gate NAND1 and an input of delay circuit D2. Delay circuit D1 may include an inverter chain having an odd number of stages. Thus, delay circuit D1 may provide a delayed and inverted output with respect to the signal received from node N1.

Delay circuit D2 may have an output connected to an input of NAND gate NAND1. Delay circuit D2 may include an inverter chain having an odd number of stages. Thus, delay circuit D2 may provide a delayed and inverted output with respect to the signal received from delay circuit D1. NAND gate NAND1 may have an output connected to an input of NAND gate NAND2 and an input of delay circuit D3. Delay circuit D3 may have an output connected to an input of NAND gate NAND2. Delay circuit D3 may include an inverter chain having an even number of stages. Thus, delay circuit D3 may provide a delayed output with respect to the signal received from NAND gate NAND1. Element ratios, such as transistors, may be adjusted in delay circuit D3 to provide a rising edge delay, so that a falling edge of the input signal received may propagate through delay circuit D3, but a rising edge may be delayed by a predetermined time period. NAND gate NAND2 may generate boosting control signal PREVBT at an output.

The operation of boosting control circuit 5 will now be explained.

Initially, control signal ACT/REF may be logic low and row enable signal RE may be logic low. Thus, transistor Tr1 may be turned on and node N1 may be pulled to a logic high by transistor Tr1. Delay circuit D1 may provide a logic low output. Thus, delay circuit D2 may provide a logic high output. With an input at logic low, NAND gate NAND1 may provide a logic high output to an input of NAND gate NAND2. Delay circuit D3 may provide a logic high output to the other input of NAND gate NAND2. With both inputs at NAND gate NAND2 at logic high, boosting control signal PREVBT may be logic low.

When command decoder 1 (FIG. 1), receives a command CMD that indicates a word line is to be activated, control signal ACT/REF may transition to logic high. With control signal ACT/REF logic high and row enable signal RE logic low, both transistors (Tr2 and Tr3) may be turned on and node Ni may be pulled low. Delay circuit D1 may provide a logic high output after a predetermined delay period. Because the output of delay circuit D2 may still be logic high, the output of NAND gate NAND1 may transition to logic low. With an input of NAND gate NAND2 at logic low, boosting control signal PREVBT may transition to logic high. In this way, delay circuit D1 may substantially provide the predetermined delay from the rising edge of control signal ACT/REF to the rising edge of boosting control signal PREVBT.

Because delay circuit D3 may provide a predetermined delay for a rising edge only, the output of delay circuit D3 may become logic low shortly after NAND gate NAND1 provides a logic low output.

A predetermined delay (determined by delay circuit D2) after the output of delay circuit D1 transitions high, the output of delay circuit D2 may transition to logic low. Thus, the output of NAND gate NAND1 may transition back to logic high. However, because the output of delay circuit D3 is still at logic low, boosting control signal PREVBT may remain logic high. However, a predetermined delay (determined by delay circuit D3) after the output of NAND gate NAND1 becomes logic high, the output of delay circuit D3 may become logic high. With both inputs to NAND gate NAND2 logic high, boosting control signal PREVBT may become logic low. In this way, boosting control signal may have a pulse width substantially determined by delay circuits (D2 and D3).

Thus, a predetermined delay (determined by delay circuit D1) after control signal ACT/REF transitions to logic high, boosting control signal PREVBT may-become logic high. Then a predetermined delay (determined by the sum of delay circuits D1 and D2) later, boosting control signal PREVBT may return logic low. In this way, boosting control signal PREVBT may be a delayed one-shot pulse having a predetermined pulse width.

Delay circuit D2 and NAND gate NAND1 may functionally form a positive edge triggered one-shot having a negative pulse output. Delay circuit D3 and NAND gate NAND2 may functionally form a pulse extender or widener having a positive pulse output.

Shortly, after control signal ACT/REF becomes logic high, row enable signal RE may become logic high. Thus, transistor Tr3 may be turned off. However, the logic state of node N1 may be maintained by latch L1.

Control signal ACT/REF may be a pulse. If the pulse width of control signal ACT/REF is equal to or greater than the desired predetermined pulse width of boosting control signal PREVBT, delay circuits (D2 and D3) may be omitted.

Figure 3:
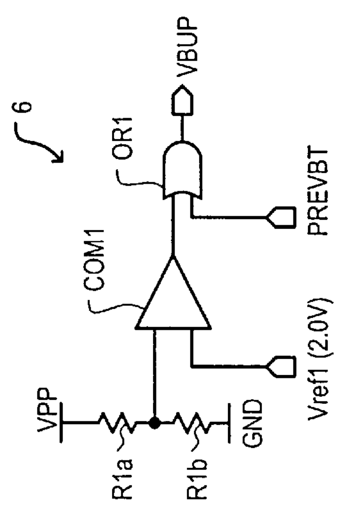
FIG. 3 is a circuit schematic diagram of a boosted potential detection circuit according to one embodiment.

Referring now to FIG. 3, a circuit schematic diagram of boosted potential detection circuit 6 according to one embodiment is set forth. Boosted potential detection circuit 6 can be the boosted potential detection circuit 6 in semiconductor memory device 50 illustrated in FIG. 1.

Boosted potential detection circuit 6 may receive a reference potential Vref1, boosted potential VPP, and boosting control signal PREVBT as inputs and may provide a boosted voltage signal VBUP as an output.

Boosted potential detection circuit 6 can include resistor devices (R1*a* and R1*b*), comparator COM1 and OR gate OR1. Resistor device R1*a* may have one terminal connected to boosted potential VPP and another terminal connected to a terminal of resistor device R1*b* at a resistor connection node. Resistor device R1*b* can have another terminal connected to ground potential GND. Comparator COM1 may have one input connected to resistor connection node and another terminal connected to receive reference potential Vref1. The reference potential Vref1 may be approximately 2.0V, as just one example.

Comparator COM1 may provide an output to an input of OR gate OR1. OR gate OR1 may receive boosting control signal PREVBT at another input and may generate boosted voltage signal VBUP.

The operation of boosted potential detection circuit 6 will now be explained.

If boosting control signal PREVBT is logic high, OR gate OR1 may provide a logic high boosted voltage signal VBUP. (4

Resistor devices (R1*a* and R1*b*) may act as a voltage divider to provide a potential at an input of comparator COM1 that may be proportional to boosted potential VPP. Resistor devices (R1*a* and R1*b*) may have resistance values of approximately 1000 kΩ, as just one example. In this way, the potential provided at the input of comparator COM1 may be approximately equal to one-half the potential of boosted potential VPP. If boosted potential VPP drops below 4.0 volts, the connection node of resistor devices (R1*a* and R1*b*) may have a potential below 2.0 volts. Comparator COM1 may then provide a high output to an input of OR gate OR1. Thus, OR gate OR1 may provide a logic high boosted voltage signal VBUP. However, if boosted potential VPP is above 4.0 volts, the connection node of resistor devices (R1*a* and R1*b*) may have a potential above 2.0 volts. Comparator COM1 may then provide a low output to an input of OR gate OR1. In this condition, boosted voltage signal VBUP may be logic low if boosting control signal PREVBT is also logic low.

Thus, boosted potential detection circuit 6 may indicate if boosted potential VPP has dropped below a predetermined potential (approximately 4 volts, as just one example) or if a word line is to be activated (boosting control signal PREVBT becomes high). In this way, boosted potential detection circuit 6 may indicate that more charge may be supplied to boosted potential VPP.

Figure 4:
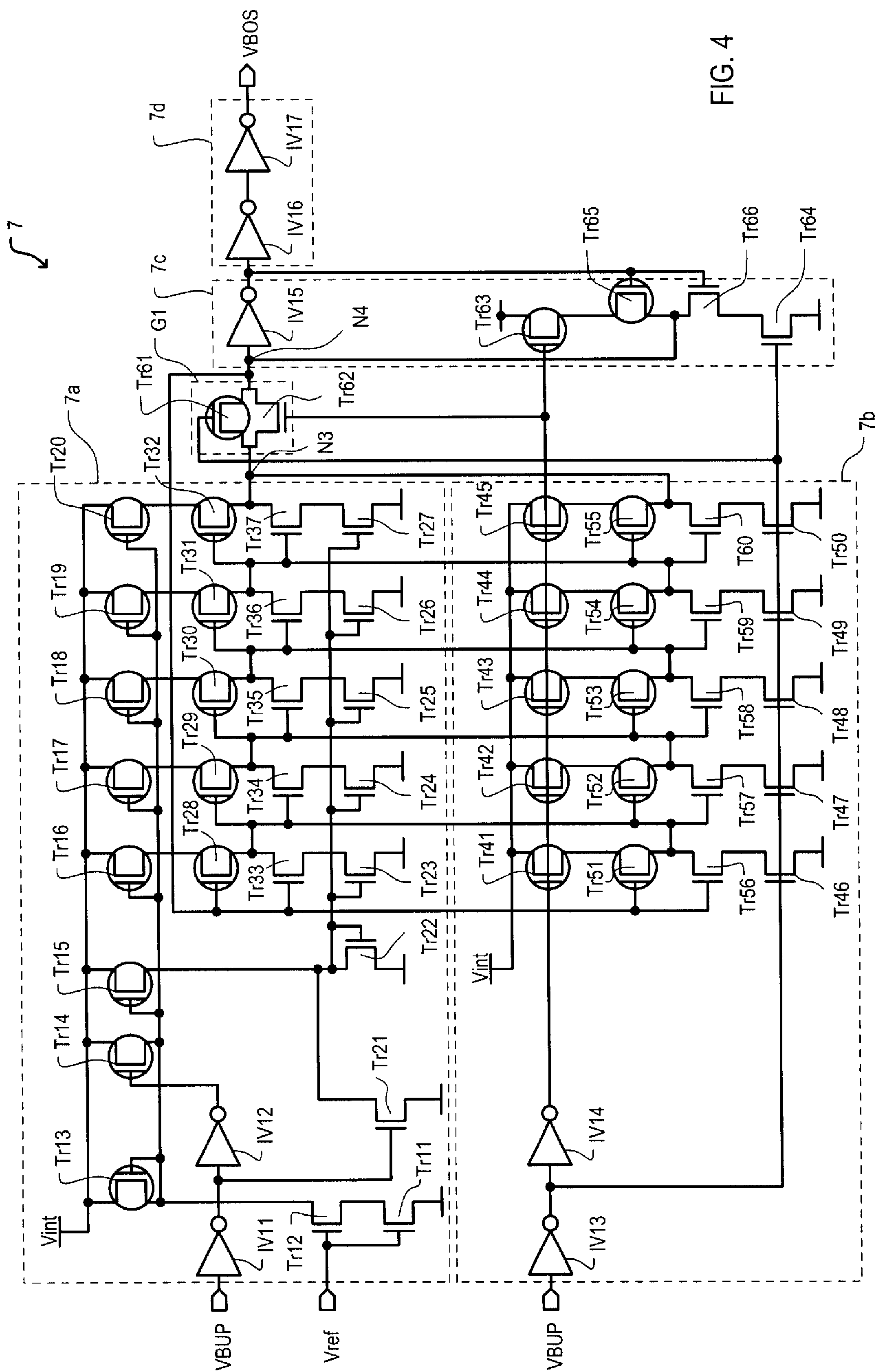
FIG. 4 is a circuit schematic diagram of an oscillator circuit according to one embodiment.

Referring now to FIG. 4, a circuit schematic diagram of oscillator circuit 7 according to one embodiment is set forth. Oscillator circuit 7 can be oscillator circuit 7 in semiconductor memory device 50 illustrated in FIG. 1.

Oscillator circuit 7 may receive boosted voltage signal VBUP and a reference potential Vref and may generate an oscillation signal VBOS. Oscillator circuit 7 may include an oscillating signal generator 7*a*, an oscillator preset circuit 7*b*, an oscillator state latch circuit 7*c* and a driver circuit 7*d*.

Oscillating signal generator 7*a* may include inverters (IV11 and IV12), transistors (Tr11 to Tr37), and a transfer gate G1. Reference potential Vref may be provided to gates of transistors (Tr11 and Tr12), respectively. Transistor Tr11 may have a source connected to ground potential and may have a drain connected to a source of transistor Tr12. Transistor Tr12 may have a drain connected to a drain of transistors (Tr13 and Tr14) and a gate of transistors (Tr13 to Tr20). Transistors Tr13 to Tr20 may each have a source connected to a power supply Vint. Power supply Vint may be an internally generated power supply, as just one example. Transistor Tr15 may have a drain connected to a drain of transistors (Tr21 and Tr22) and gates of transistors (Tr22 to Tr27). Transistors (Tr16 to Tr20) may each have a drain connected to a source of transistors (Tr28 to Tr32), respectively. Transistors (Tr21 to Tr27) may each have a source connected to ground potential. Transistors (Tr23 to Tr27) may each have a drain connected to a source of transistors (Tr33 to Tr37), respectively. Inverter IV11 may receive boosted voltage signal VBUP at an input and may provide an output to a gate of transistor Tr21 and an input of inverter IV12. Inverter IV12 may provide an output to a gate of transistor TR14.

Transistors (Tr11, Tr12, and Tr21 to Tr27) may be n-type IGFETs. Transistors (Tr13 to Tr20) may be p-type IGFETs.

Transistors (Tr28 and Tr33) can each have a control gate connected to an output of transfer gate G1. Transistors (Tr28 and Tr33) can have drains commonly connected. Transistors (Tr29 and Tr34) can each have a control gate connected to drains of transistors (Tr28 and Tr33). Transistors (Tr29 and Tr34) can have drains commonly connected. Transistors (Tr30 and Tr35) can each have a control gate connected to drains of transistors (Tr29 and Tr34). Transistors (Tr30 and Tr35) can have drains commonly connected. Transistors (Tr31 and Tr36) can each have a control gate connected to drains of transistors (Tr30 and Tr35). Transistors (Tr31 and Tr36) can have drains commonly connected. Transistors (Tr32 and Tr37) can each have a control gate connected to drains of transistors (Tr31 and Tr36). Transistors (Tr32 and Tr37) can have drains commonly connected at node N3. Transistors (Tr28 to Tr32) may be p-type IGFETs. Transistors (Tr33 to Tr37) may be n-type IGFETs.

Transfer gate G1 may have an input connected to drains of transistors (Tr32 and Tr37) at node N3 and an output connected to oscillator state latch circuit 7*c* at node N4. Transfer gate G1 may include transistors (Tr61 and Tr62). Transistor Tr61 may have a source/drain connected to drains of transistors (Tr32 and Tr37), another source/drain connected to oscillator state latch circuit 7*c* at node N4, and a gate may receive a signal generated by oscillator preset circuit 7*b*. Transistor Tr62 may have a source/drain connected to drains of transistors (Tr32 and Tr37), another source/drain connected to oscillator state latch circuit 7*c* at node N4, and a gate may receive a signal generated by oscillator preset circuit 7*b*. Transistor Tr61 may be a p-type IGFET. Transistor Tr62 may be an n-type IGFET.

Oscillator preset circuit 7*b* may include inverters (IV13 and IV14) and transistors (Tr41 to Tr60). Inverter IV13 may receive boosted voltage signal VBUP at an input and may provide an output to an input of inverter IV14 and a gate of transistors (Tr46 to Tr50, Tr64, and Tr61). Inverter IV14 my provide an output to a gate of transistors (Tr41 to Tr45, Tr63, and Tr62). Transistors (Tr41 to Tr45) may each have a source connected to power supply Vint and may each have a drain connected to a source of transistors (Tr51 to TrS5), respectively. Transistors (Tr46 to Tr50) may each have a source connected to ground potential and may each have a drain connected to a source of transistors (Tr56 to Tr60), respectively.. Transistors (Tr51 and Tr56) may have a gate connected to node N4 and may have drains commonly connected to the gates of transistors (Tr52 and Tr57). Transistors (Tr52 and Tr57) may have drains commonly connected to the gates of transistors (Tr53 and Tr58). Transistors (Tr53 and Tr58) may have drains commonly-connected to the gates of transistors (Tr54 and Tr59). Transistors (Tr54 and Tr59) may have drains commonly connected to the gates of transistors (Tr55 and Tr60). Transistors (Tr55 and Tr60) may have drains commonly connected to node N3. Transistors (Tr41 to Tr45 and Tr51 to Tr55) may be p-type IGFETs. Transistors (Tr46 to Tr50 and Tr56 to Tr60) may be n-type IGFETs.

Additionally, transistors (Tr51 and Tr56) of oscillator preset circuit 7*b* may have drains commonly connected to the drains of transistors (Tr28 and Tr33) of oscillating signal generator 7*a*. Transistors (Tr52 and Tr57) of oscillator preset circuit 7*b* may have drains commonly connected to the drains of transistors (Tr29 and Tr34) of oscillating signal generator 7*a*. Transistors (Tr53 and Tr58) of oscillator preset circuit 7*b* may have drains commonly connected to the drains of transistors (Tr30 and Tr35) of oscillating signal generator 7*a*. Transistors (Tr54 and Tr59) of oscillator preset circuit 7*b* may have drains commonly connected to the drains of transistors (Tr31 and Tr36) of oscillating signal generator 7*a*. Transistors (Tr55 and Tr60) of oscillator preset circuit 7*b* may have drains commonly connected to the drains of transistors (Tr32 and Tr37) of oscillating signal generator 7*a*.

Oscillator state latch circuit 7*c* may include inverter IV15 and transistors (Tr63 to Tr66). Inverter IV15 may have an input connected to node N4 and an output connected to a gate of transistors (Tr65 and Tr66). Transistor Tr63 can have a source connected to power supply Vint and a drain connected to a source of transistor Tr65. Transistor Tr64 can have a source connected to the ground potential and may have a drain connected to a source of transistor Tr66. Transistors (Tr65 and Tr66) may have drains commonly connected to node N4. Transistors (Tr63 and Tr65) can be p-type IGFETs. Transistors (Tr64 and Tr66) can be n-type IGFETs.

Driver circuit 7*d* may include inverters (IV16 and IV17). Inverter IV16 can have an input connected an output of inverter IV15 and an output connected to an input of inverter IV17. Inverter IV17 may generate oscillation signal VBOS at an output.

The operation of oscillator circuit 7 will now be described.

Oscillating signal generator 7*a* may form a ring oscillator in which an odd number of inverters may be arranged in a ring. Transistors (Tr28 and Tr33) may form an inverter. Transistors (Tr29 and Tr34) may form an inverter. Transistors (Tr30 and Tr35) may form an inverter. Transistors (Tr31 and Tr36) may form an inverter. Transistors (Tr32 and Tr37) may form an inverter. When transfer gate G1 is enabled (conducting), oscillating signal generator 7*a* may be a ring oscillator having five inverter stages connected in a ring and may provide an oscillating output signal at node N4.

Within oscillating signal generator 7*a*, transistors (Tr11 to Tr13 and Tr15 to Tr20 and Tr22 to Tr27) may provide a current source to the ring oscillator portion of oscillating signal generator 7*a*. Reference potential Vref may be used to set the amount of current supplied. Thus, reference potential Vref may be used to adjust the frequency of oscillation of the ring oscillator portion. Reference potential Vref may be provided to gates of transistors (Tr11 and Tr12). This may set the current flowing through diode-configured transistor Tr13. Transistors (Tr15 to Tr20) may each form current-mirror type configurations and may thus have current that can be proportional (depending on device sizes) to the current flowing through transistor Tr13. The current flowing through transistor Tr15 may also flow through diode configured transistor Tr22. Transistors (Tr23 to Tr27) may each form current-mirror type configurations and may thus have current that can be proportional (depending on device sizes) to the current flowing through transistor Tr22.

Transistors (Tr14 and Tr21) may be considered as disable devices. When transistor Tr14 is turned on, gates of transistors (Tr13 and Tr15 to Tr20) can be pulled high. Thus, transistors (Tr13 and Tr15 to Tr20) can be turned off and current flow can be disrupted in the ring oscillator portion of oscillating signal generator 7*a*. Likewise, when transistor Tr21 is turned on, gates of transistors (Tr22 to Tr27) can be pulled low. Thus, transistors (Tr22 to Tr27) can be turned off and current flow can be disrupted in the ring oscillator portion of oscillating signal generator 7*a*. By disrupting current flow in the oscillating signal generator 7*a*, current consumption may be reduced and overall chip power consumption may be reduced.

When boosted voltage signal VBUP is logic high, oscillating signal generator 7*a* may be enabled and may provide an oscillating signal at node N4. When boosted voltage signal VBUP is logic low, oscillating signal generator 7*a* may be disabled.

When boosted voltage signal VBUP is logic low, oscillator preset circuit 7*b* may have transistors (Tr41 to Tr50) that may be turned on. Thus, tri-stateable inverters formed by transistors (Tr41 to Tr60) may be enabled. The first inverter input (gates of transistors Tr51 and Tr56) may receive a logic level from node N4 (which may be latched). After propagating through the series connected five tri-stateable inverters formed by transistors (Tr41 to Tr60), an opposite logic level than node N4 may be applied to node N3. In this way, oscillator preset circuit 7*b* may provide a logic state on node N3 that is the opposite to the logic state at node N4.

Additionally, each of the tri-stateable inverters formed within oscillator preset circuit 7*b* may set the outputs of all inverters forming the ring oscillator of oscillating signal generator 7*a* to opposite logic states to the last logic state when oscillating signal generator 7*a* was enabled.

When boosted voltage signal VBUP is logic low, transfer gate G1 may be disabled.

When boosted voltage signal VBUP is logic low, oscillator state latch circuit 7*c* may be enabled and may latch a logic level at node N4. When boosted voltage signal VBUP is logic low, transistors (Tr63 and Tr64) may be turned on. Thus, inverter IV15 and transistors (Tr63 to Tr66) may operate as a flip-flop type latching circuit and may latch a logic level at node N4.

Driver circuit 7*d* may receive the logic level latched by oscillator state latch circuit 7*c* and may generate oscillation signal VBOS.

When boosted voltage signal VBUP transitions to a logic high, oscillating signal generator 7*a* may be enabled. Oscillator state latch circuit 7*c* may be turned off (transistors Tr63 and Tr64 may be turned off). Transfer gate G1 may be turned on and the opposite logic level from node N4 that is applied to node N3 may be applied to node N4. In this way, oscillation signal VBOS may change only a short time period after oscillator circuit 7 receives a high going edge of boosted voltage signal VBUP.

Oscillator preset circuit 7*b* may provide a predetermined delay to change the logic level of node N3 when boosted voltage signal transitions to a logic low. This may eliminate unwanted glitches on oscillation signal VBOS when boosted voltage signal VBOS makes transitions in logic state.

Next, the operation of semiconductor memory device 50 will be described with reference to FIG. 1 to FIG. 6.

Figure 5:
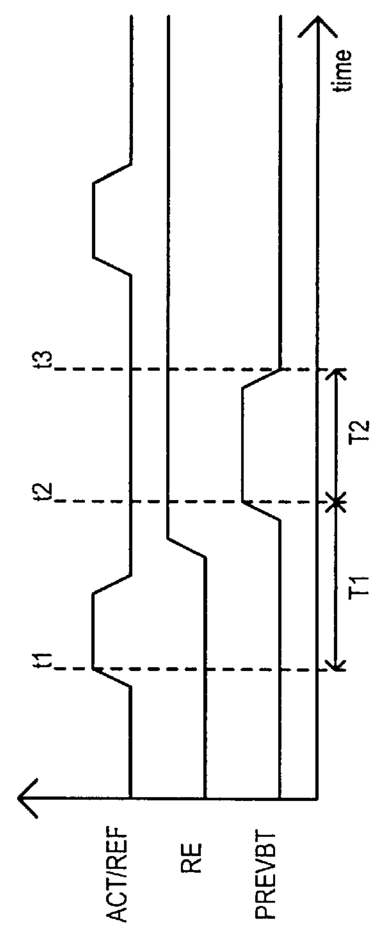
FIG. 5 is a timing diagram illustrating the operation of a boosting control circuit according to one embodiment.

Referring now to FIG. 5, a timing diagram illustrating the operation of boosting control circuit 5 is set forth.

The timing diagram of FIG. 5 can include control signal ACT/REF, row enable signal RE, and boosting control signal PREVBT.

When command decoder 1 (FIG. 1) receives a command that indicates a word line is to be activated, control signal ACT/REF may pulse high. This condition may be illustrated at time t1. This high going edge of control signal ACT/REF may be received by boosting control circuit 5 (FIG. 2) at the gates of transistors (Tr1 and Tr2), which can turn on transistor Tr2. Because row enable signal RE is low at time t1 (FIG. 5), transistor Tr3 may also be turned on and node N1 may be pulled low. After a predetermined delay provided by delay circuit D1, the input to NAND gate NAND1 may transition high, and NAND gate NAND1 may provide a low output to NAND gate NAND2. Thus, boosting control signal PREVBT may transition high after a delay T1. In this way, delay T1 may be substantially determined by delay circuit D1.

Because delay circuit D3 may provide a predetermined delay for a rising edge only, the output of delay-circuit D3 may become logic low shortly after NAND gate NAND1 provides a logic low output.

A predetermined delay (determined by delay circuit D2) after the output of delay circuit D1 transitions high, the output of delay circuit D2 may transition to logic low. Thus, the output of NAND gate NAND1 may transition back to logic high. However, because the output of delay circuit D3 is still at logic low, boosting control signal PREVBT may remain logic high. A predetermined delay (determined by delay circuit D3) after the output of NAND gate NAND1 becomes logic high, the output of delay circuit D3 may become logic high. With both inputs to NAND gate NAND2 logic high, boosting control signal PREVBT may become logic low. In this way, boosting control signal may have a pulse width substantially determined by delay circuits (D2 and D3).

Thus, after a delay T2 (time t3), which may be substantially determined by delay circuits (D2 and D3), boosting control signal PREVBT may return low. Time delays T1 and T2 may be adjusted by adjusting the delays of delay circuits (D1 to D3) in accordance with a desired charge transfer to boosted potential VPP when a word line may be activated.

Row enable signal RE may transition to logic high after time t1. However, latch circuit L1 (FIG. 2) may keep node N1 in the logic low state until control signal ACT/REF returns low. In this way, node N1 may be prevented from floating.

After time t3, command decoder 1 (FIG. 1) may receive another command that indicates a word line is to be activated. However, a word line may not be activated until row enable signal RE returns low and memory array 10 (FIG. 1) has been precharged. Thus, boosting control signal PREVBT may not be generated. As noted, when row enable signal RE is high, transistor Tr3 (FIG. 2) may be turned off.

Figure 6:
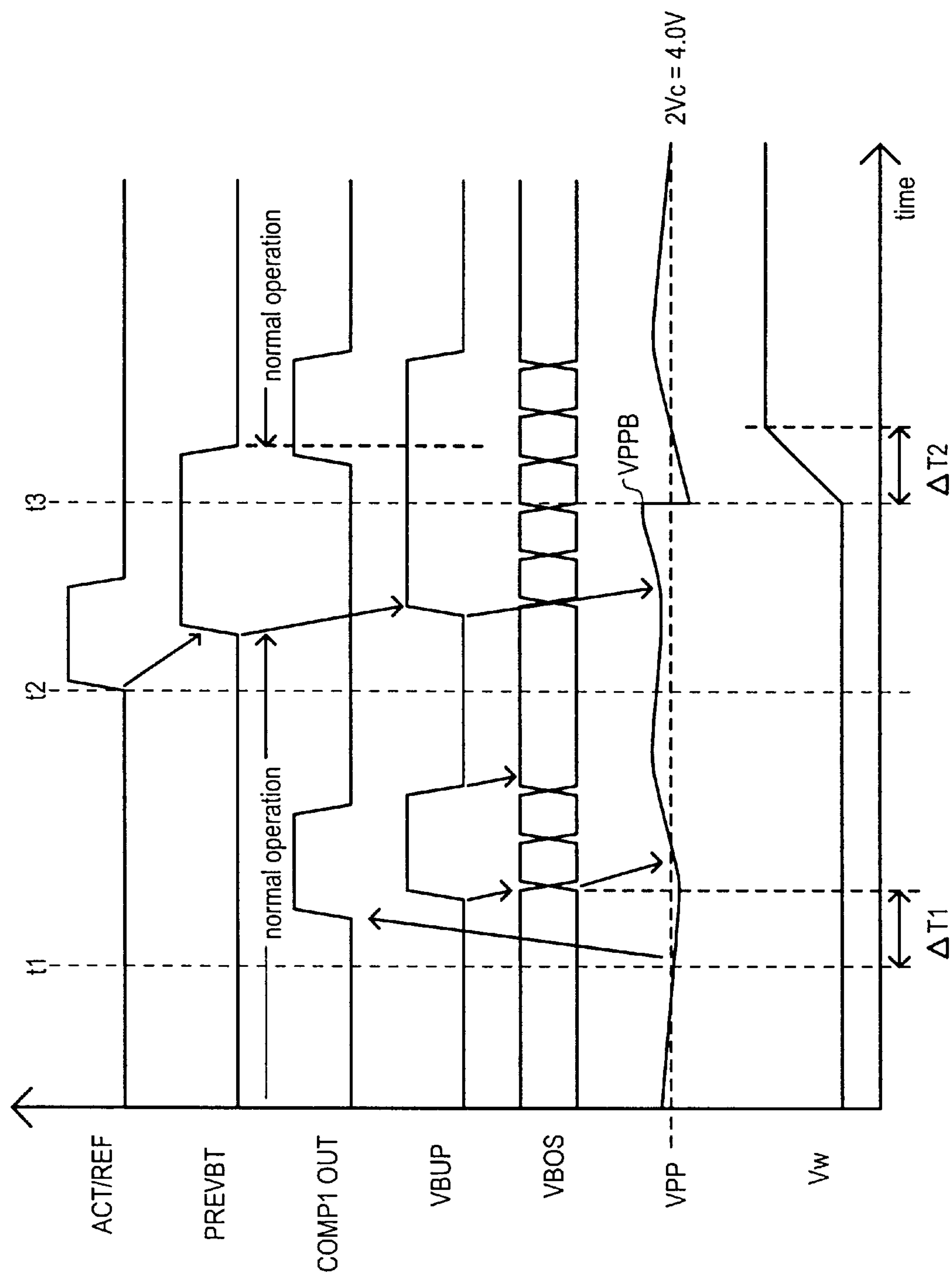
FIG. 6 is a timing diagram illustrating the boosting operation according to an embodiment.

Referring now to FIG. 6, a timing diagram illustrating the boosting operation according to an embodiment is set forth.

The timing diagram of FIG. 6 can include control signal ACT/REF, boosting control signal PREVBT, output of comparator circuit COM1 (FIG. 3), boosted voltage signal VBUP, oscillation signal VBOS, boosted potential VPP, and potential of word line 11 (FIG. 1).

During a normal operation of boosted potential circuit 6 (FIG. 3), boosting control signal PREVBT may be low. Boosted potential circuit 6 may generate a boosted voltage signal VBUP when comparator COM1 indicates that boosted potential VPP has fallen below approximately 4.0 V. This can be indicated with the output of comparator COM1 becomes high. As seen in FIG. 6, at time t1, the boosted potential VPP may fall below 4.0 V. This may cause the output of comparator circuit COM1 to become high, thus causing boosted voltage signal VBUP to go high.

Oscillation circuit 7 (FIG. 4) may receive the logic high boosted voltage signal VBUP. This may cause oscillating signal generator 7*a* to begin to oscillate. As noted earlier, the current state of oscillation signal VBOS may have been latched by oscillator state latch circuit 7*c*. Oscillator preset circuit 7*c* may have received the current state of oscillation signal VBOS by way of node N4 and may have preset oscillating signal generator 7*a* in a way such that the opposite logic state may have been placed on node N3. In this way, oscillation signal VBOS may make a logic transition shortly after boosted voltage signal VBUP becomes active (logic high). This may be indicated at a delay of ΔT1 after time t1 in FIG. 6. In this way, booster circuit 8 (FIG. 1) may quickly provide charge to boosted potential VPP. Oscillation signal VBOS may oscillate thereafter at a frequency determined by oscillation signal generator 7*a*. This frequency may be adjusted by modifying the potential level of reference potential Vref. Oscillation signal VBOS may continue to oscillate until booster circuit 8 (FIG. 1) boosts the boosted potential VPP to a potential above approximately 4.0 V. Then boosted potential detection circuit 6 may provide a comparator COM1 output that may become logic low and boosted voltage signal VBUP may become logic low.

Referring still to FIG. 6, at time t2 control signal ACT/REF may pulse high. This may indicate that command decoder 1 (FIG. 1) has received a command in which a word line may be activated. At time delay that may be substantially determined by delay circuit D1 (FIG. 2) after time t1, boosting control signal PREVBT may become high. Boosted potential detection circuit 6 may receive boosting control signal PREVBT and may produce a logic high boosted voltage signal VBUP. Oscillator circuit 7 may receive the logic high boosted voltage signal VBUP. As indicated earlier, oscillator state latch circuit 7*c* may have latched a logic state of oscillation signal VBOS by latching a logic state at node N4. Oscillator preset circuit 7*b* may have provided an opposite state to node N3. This may enable oscillation signal VBOS to change logic level shortly after receiving and enabled (logic high) boosted voltage signal VBUP. In this way, booster circuit 8 (FIG. 1) may quickly provide charge to boosted potential VPP.

At time t3, word line 11 (FIG. 1) may rise. This may place a load on boosted potential VPP. Due to the charge loss from smoothing capacitor Cd (FIG. 1), boosted potential VPP may dip below approximately 4.0 V. Boosted potential detection circuit 6 (FIG. 3) may provide a comparator COM1 output that may become logic high. This may keep boosted voltage signal VBUP high even after boosting control signal PREVBT returns low. This may keep oscillator circuit 7 enabled and booster circuit 8 may keep supplying charge to boosted potential VPP. A time delay ΔT2 after time t3, boosted potential VPP and word line potential Vw, may become above approximately 4.0 V. Thus, comparator COM1 output and boosted voltage signal may become low. This may disable oscillator circuit 7 and booster circuit 8 may stop supplying charge to boosted potential VPP.

Oscillator state latch circuit 7*c* may latch the logic state of oscillation signal VBOS and oscillator preset circuit 7*b* may preset oscillator circuit 7 to quickly change the logic state of oscillation signal VBOS when boosted voltage signal VBUP returns high again.

The embodiments may allow boosted potential VPP to receive charge before a charge-consuming event may deplete charge from a smoothing capacitor Cd. This may enable boosted potential VPP to better maintain a predetermined potential.

Figure 7:
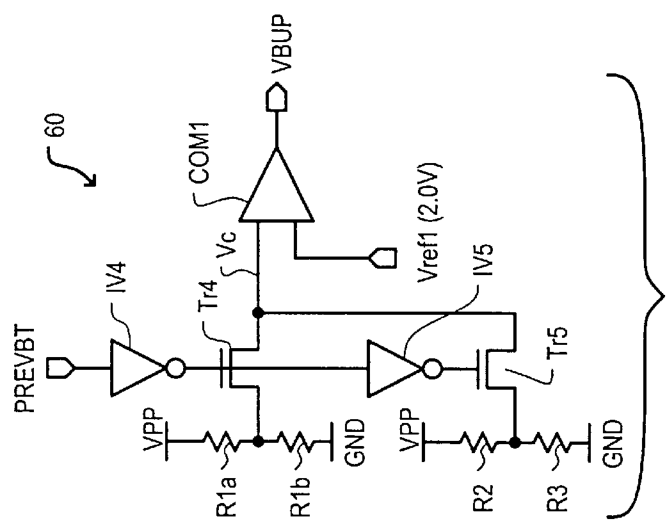
FIG. 7 is a circuit schematic diagram of a boosted potential detection circuit according to one embodiment.
Figure 9:
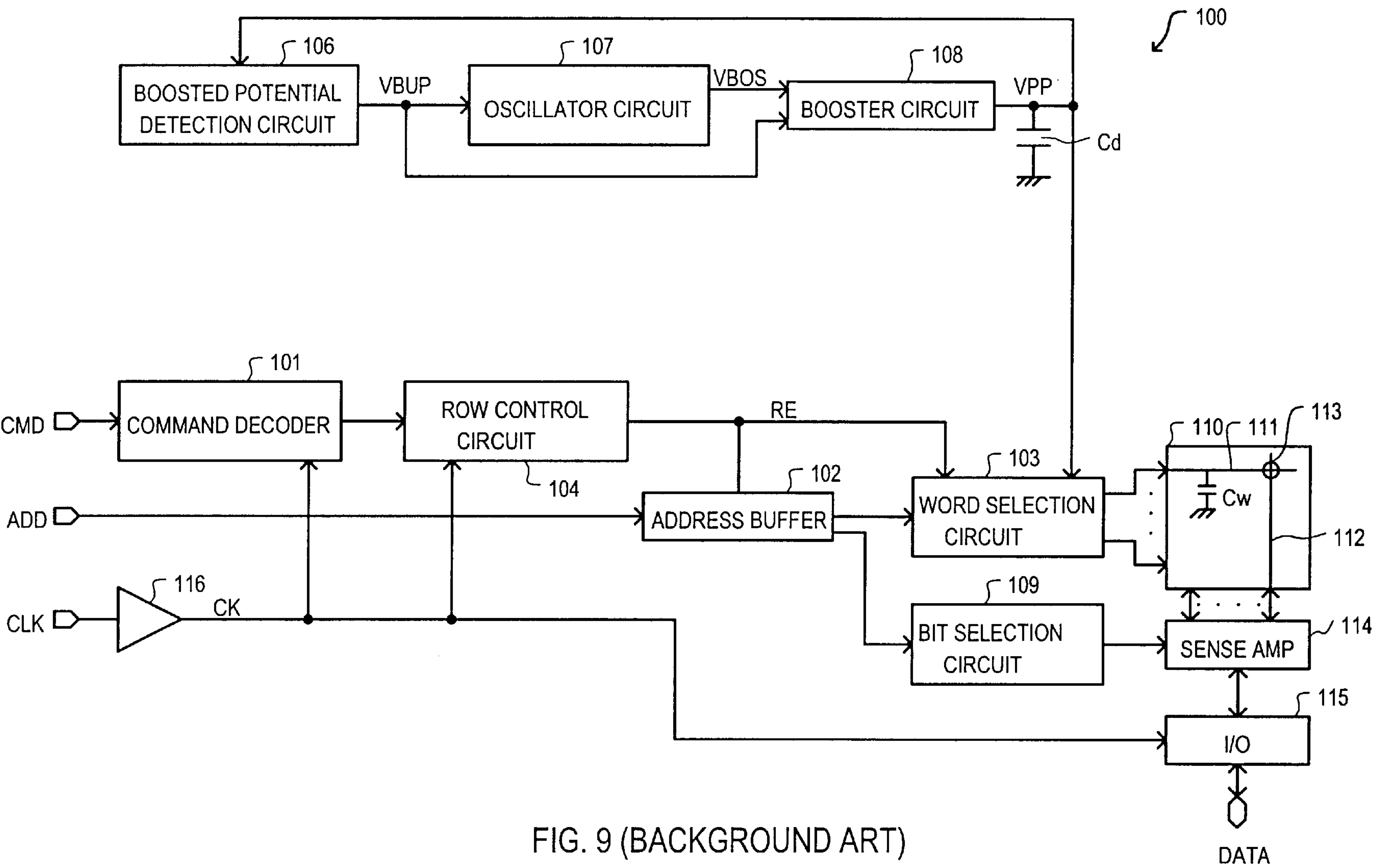
FIG. 9 is a block schematic diagram of a conventional DRAM.
Figure 10:
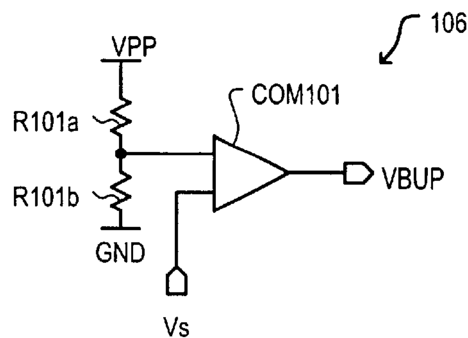
FIG. 10 is a circuit schematic diagram of a conventional boosted potential detection circuit.
Figure 11:
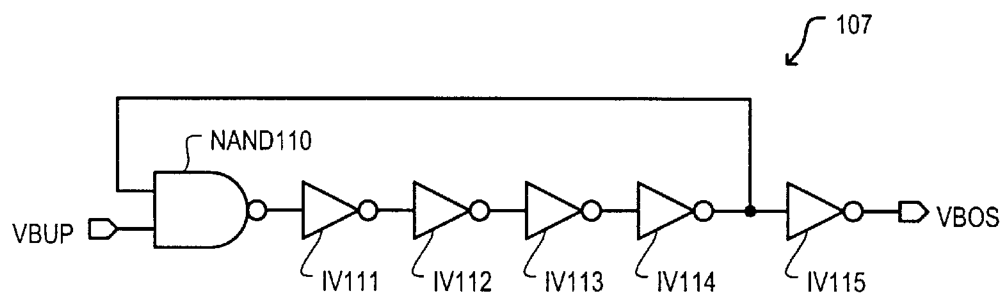
FIG. 11 is a circuit schematic diagram of a conventional oscillator circuit.
Figure 13:
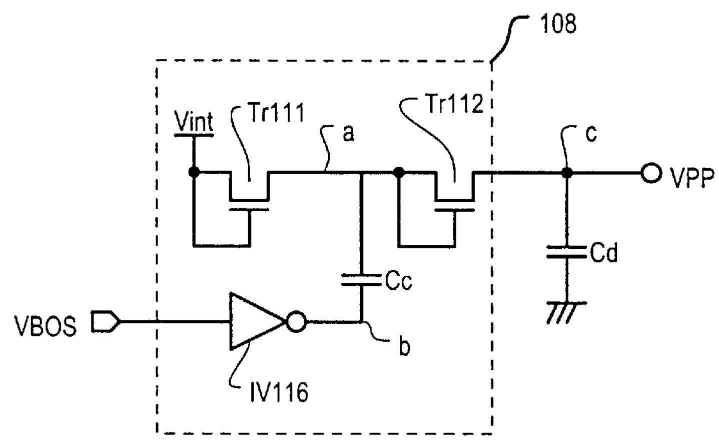
FIG. 13 is a schematic diagram of a booster circuit.
Figure 12:
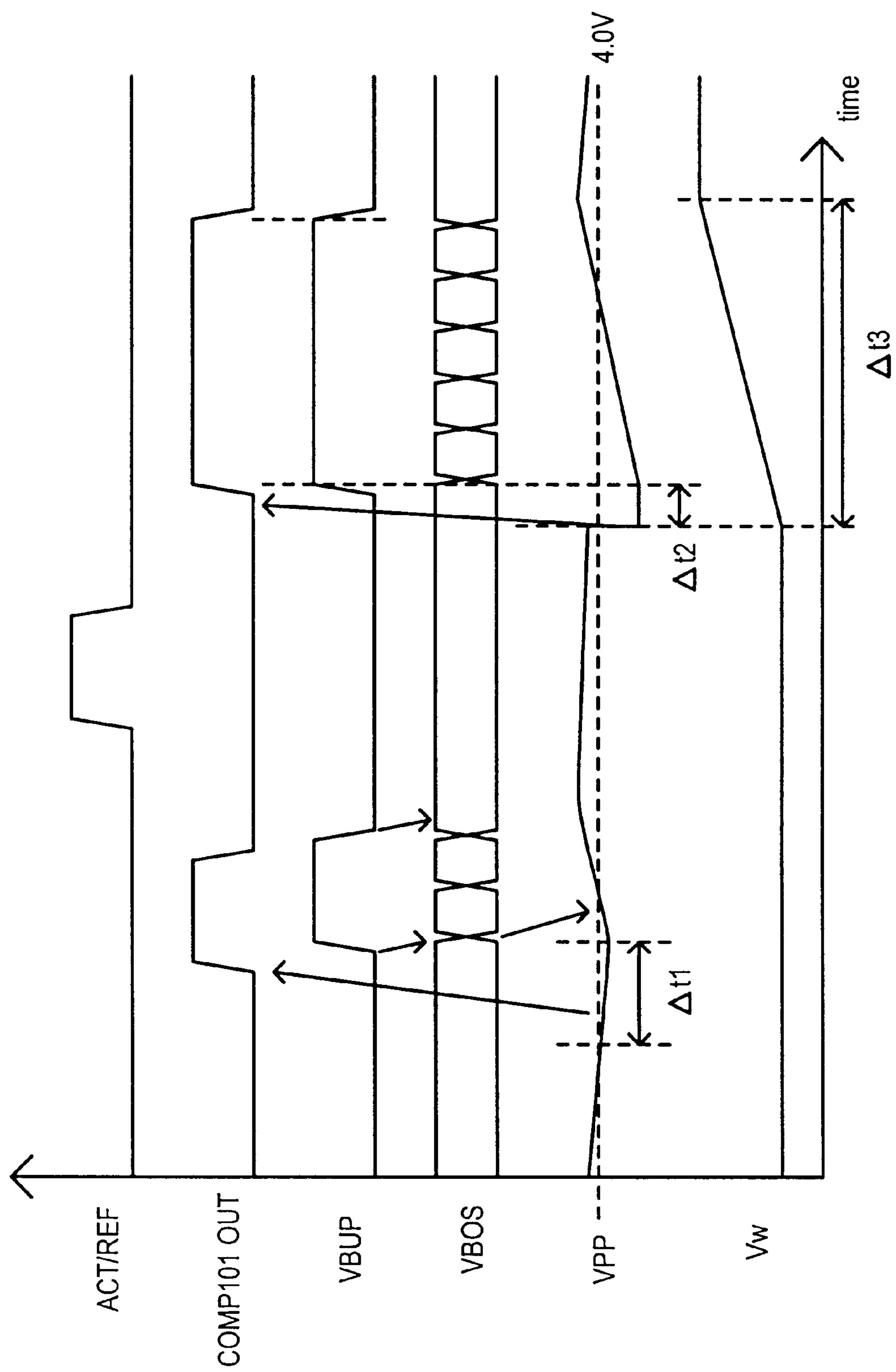
FIG. 12 is a timing diagram illustrating the boosting operation of a conventional DRAM.

Referring now to FIG. 7, a circuit schematic diagram of a boosted potential detection circuit according to one embodiment is set forth and given the general reference character 60. Boosted potential detection circuit 60 may be used as boosted potential detection circuit 6 in semiconductor memory device 50 illustrated in FIG. 1.

Boosted potential detection circuit 60 may receive a reference potential Vref1, boosted potential VPP, and boosting control signal PREVBT as inputs and may provide a boosted voltage signal VBUP as an output.

Boosted potential detection circuit 60 can include resistor devices (R1*a,* R1*b,* R2, and R3), inverters (IV4 and IV5), transistors (Tr4 and Tr5), and comparator COM1. Resistor device R1*a* may have one terminal connected to boosted potential VPP and another terminal connected to a terminal of resistor device R1*b* at a resistor connection node. Resistor device R1*b* can have another terminal connected to ground potential GND. Resistor device R2 may have one terminal connected to boosted potential VPP and another terminal connected to a terminal of resistor device R3 at a resistor connection node. Resistor device R3 can have another terminal connected to ground potential GND. Transistor Tr4 may have a source/drain connected to resistor connection node of resistors (R1*a* and R1*b*) and another source/drain connected to an input of comparator COM1. Transistor Tr5 may have a source/drain connected to resistor connection node of resistors (R2 and R3) and another source/drain connected to the input of comparator COM1. Comparator COM1 may have another input connected to receive reference potential Vref1. Reference potential Vref1 may be approximately 2.0V, as just one example. Comparator COM1 may provide boosted voltage signal VBUP as an output.

Inverter IV4 may receive boosting control signal PREVBT at an input and may provide an output to a gate of transistor Tr4 and an input of inverter IV5. Inverter IV5 may provide an output to a gate of transistor Tr5.

The operation of boosted potential detection circuit 60 will now be explained.

Resistor devices (R1*a* and R1*b*) may act as a voltage divider to provide a potential at their respective resistor connection node that may be proportional to boosted potential VPP. Resistor devices (R1*a* and R*l*b) may have resistance values of approximately 1000 kΩ, as just one example. In this way, the potential provided at their respective resistor connection node may be approximately equal to one-half the potential of boosted potential VPP. Resistor devices (R2 and R3) may act as a voltage divider to provide a potential at their respective resistor connection node that may be proportional to boosted potential VPP.

Resistor device R2 may have a resistance value of approximately 1048 kΩ, as just one example. Resistor device R3 may have a resistance value of approximately 952 kQΩ, as just one example. In this way, the potential provided at their respective resistor connection node may be approximately equal to less than one-half the potential of boosted potential VPP.

If boosting control signal PREVBT is logic low, transistor Tr4 may be turned on and transistor Tr5 may be turned off. Thus, the connection node of resistor devices (R1*a* and R1*b*) may be electrically connected to the input of comparator COM1. If boosted potential VPP drops below approximately 4.0 volts, the connection node of resistor devices (R1*a* and R1*b*) may have a potential below approximately 2.0 volts. Comparator COM1 may then provide a high output to boosted voltage signal VBUP. However, if boosted potential VPP is above approximately 4.0 volts, the connection node of resistor devices (R1*a* and R1*b*) may have a potential above approximately 2.0 volts. Comparator COM1 may then provide a low output to boosted voltage signal.

If boosting control signal PREVBT is logic high, transistor Tr4 may be turned on and transistor Tr5 may be turned off. Thus, the connection node of resistor devices (R2 and R3) may be electrically connected to the input of comparator COM1. If boosted potential VPP drops below a predetermined potential, the connection node of resistor devices (R2 and R3) may have a potential below approximately 2.0 volts. Because the resistance values of resistor devices (R2 and R3) may be selected to give a potential at the connection node of resistor devices (R2 and R3) that may be greater than one-half VPP, comparator COM1 may then provide a high output to boosted voltage signal VBUP when boosted potential falls below a predetermined potential that may be greater than approximately 4.0 volts. However, if boosted potential VPP is above the predetermined potential, the connection node of resistor devices (R1*a* and R1*b*) may have a potential above approximately 2.0 volts. Comparator COM1 may then provide a low output to boosted voltage signal VBUP.

In this way, when boosting control signal PREVBT is logic high, boosted potential detection circuit 60 may regulate boosted potential VPP to ensure a predetermined potential that may be high enough to supply sufficient charge to a word line that may be selected. The predetermined potential may be determined by the ratio of resistance values of resistors (R2 and R3). The predetermined potential may be approximately determined by the equation VPP≡Vref1((R2+R3)/R3), where Vref1 is the potential of reference potential Vref1, R2 is the resistance value of resistor R2, and R3 is the resistance value of resistor R3. If R2≡952 kΩ, R3≡1048 kΩ, and Vref1≡2.0 Volts, then the predetermined potential of boosted potential when control signal PREVBT is logic high may be about 4.2 Volts.

Figure 8:
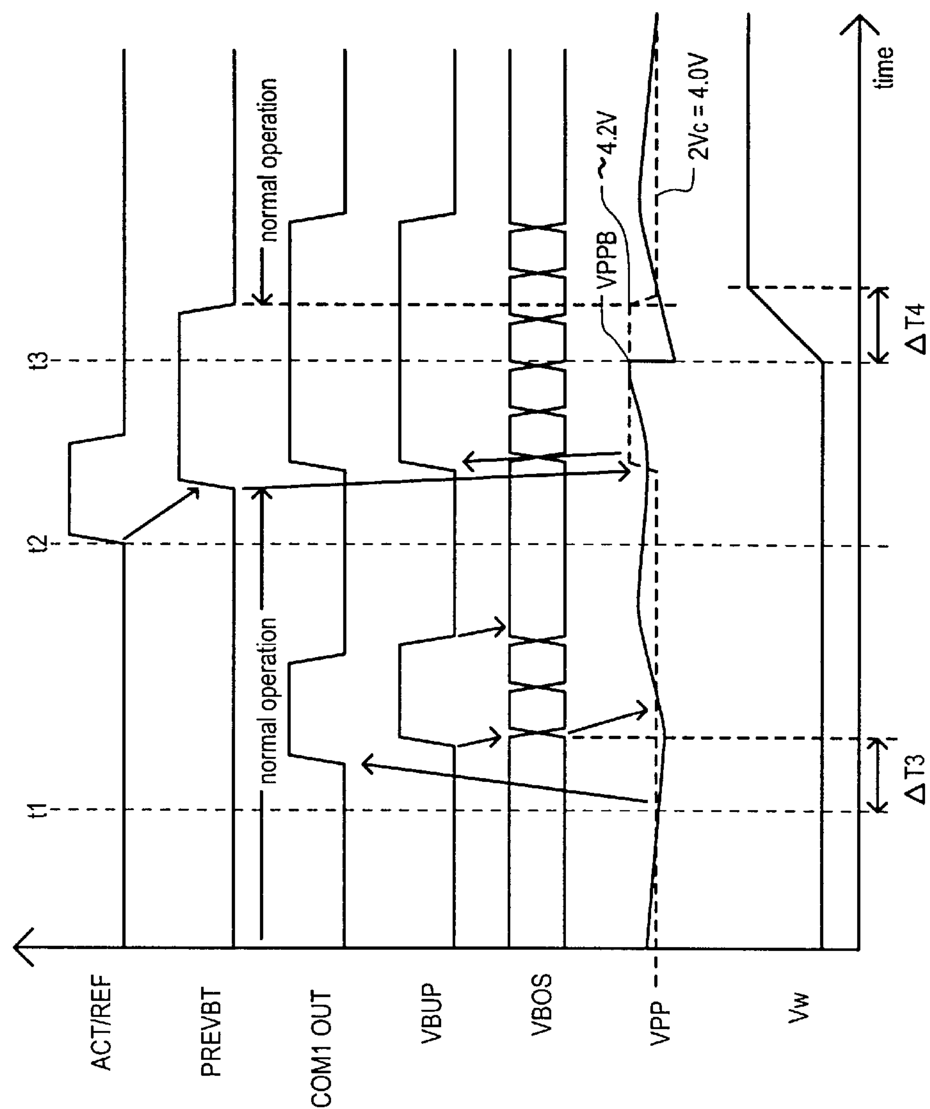
FIG. 8 is a timing diagram illustrating the boosting operation according to an embodiment.

Referring now to FIG. 8, a timing diagram illustrating the boosting operation according to an embodiment utilizing boosted potential detection circuit 60 is set forth.

The timing diagram of FIG. 8 can include control signal ACT/REF, boosting control signal PREVBT, output of comparator circuit COM1 (FIG. 7), boosted voltage signal VBUP, oscillation signal VBOS, boosted potential VPP, and potential of word line 11 (FIG. 1).

During a normal operation of boosted potential detection circuit 60 (FIG. 7), boosting control signal PREVBT may be low. In this case, resistor connection node of resistors (R1*a* and R1*b*) may be electrically connected to an input of comparator COM1. Boosted potential circuit 60 may generate a boosted voltage signal VBUP when comparator COM1 indicates that boosted potential VPP has fallen below approximately 4.0 V. This can be indicated with the output of comparator COM1 becomes high. As seen in FIG. 8, at time t1, the boosted potential VPP may fall below 4.0 V. This may cause the output of comparator circuit COM1 to become high, thus causing boosted voltage signal VBUP to go high.

Oscillation circuit 7 (FIG. 4) may receive the logic high boosted voltage signal VBUP. This may cause oscillating signal generator 7*a* to begin to oscillate. As noted earlier, the current state of oscillation signal VBOS may have been latched by oscillator state latch circuit 7*c*. Oscillator preset circuit 7*b* may have received the current state of oscillation signal VBOS by way of node N4 and may have preset oscillating signal generator 7*a* in a way such that the opposite logic state may have been placed on node N3. In this way, oscillation signal VBOS may make a logic transition shortly after boosted voltage signal VBUP becomes active (logic high). This may be indicated at a delay of ΔT3 after time t1 in FIG. 6. In this way, booster circuit 8 (FIG. 1) may quickly provide charge to boosted potential VPP. Oscillation signal VBOS may oscillate thereafter at a frequency determined by oscillation signal generator 7*a*. This frequency may be adjusted by modifying the potential level of reference potential Vref. Oscillation signal VBOS may continue to oscillate until booster circuit 8 (FIG. 1) boosts the boosted potential VPP to a potential above approximately 4.0 V. Then boosted potential detection circuit 60 may provide a comparator COM1 output that may become logic low and boosted voltage signal VBUP may become logic low.

Referring still to FIG. 8, at time t2 control signal ACT/REP may pulse high. This may indicate that command decoder 1 (FIG. 1) has received a command in which a word line may be activated. At time delay that may be substantially determined by delay circuit D1 (FIG. 2) after time t1, boosting control signal PREVBT may become high. Boosted potential detection circuit 60 may receive boosting control signal PREVBT. In this case, resistor connection node of resistors (R2 and R3) may be electrically connected to an input of comparator COM1. Boosted potential circuit 60 may generate a boosted voltage signal VBUP when comparator COM1 indicates that boosted potential VPP has fallen below a predetermined potential approximately 4.2 V. This can be indicated with the output of comparator COM1 becomes high. As seen in FIG. 8, after time t2, the boosted potential VPP may be below approximately 4.2 V. This may cause the output of comparator circuit COM1 to become high, thus causing boosted voltage signal VBUP to go high.

Oscillation circuit 7 (FIG. 4) may receive the logic high boosted voltage signal VBUP. This may cause oscillating signal generator 7*a* to begin to oscillate. As noted earlier, the current state of oscillation signal VBOS may have been latched by oscillator state latch circuit 7*c*. Oscillator preset circuit 7*b* may have received the current state of oscillation signal VBOS by way of node N4 and may have preset oscillating signal generator 7*a* in a way such that the opposite logic state may have been placed on node N3. In this way, oscillation signal VBOS may make a logic transition shortly after boosted voltage signal VBUP becomes active (logic high). This may be indicated at a delay after time t2 in FIG. 8. In this way, booster circuit 8 (FIG. 1) may quickly provide charge to boosted potential VPP. Oscillation signal VBOS may oscillate thereafter at a frequency determined by oscillation signal generator 7*a*. This frequency may be adjusted by modifying the potential level of reference potential Vref. Oscillation signal VBOS may continue to oscillate until booster circuit 8 (FIG. 1) boosts the boosted potential VPP to a potential above approximately 4.2 V. Then boosted potential detection circuit 60 may provide a comparator COM1 output that may become logic low and boosted voltage signal VBUP may become logic low.

At time t3, word line 11 (FIG. 1) may rise. This may place a load on boosted potential VPP. Due to the charge loss from smoothing capacitor Cd (FIG. 1), boosted potential VPP may dip below approximately 4.0 V. Boosted potential detection circuit 60 (FIG. 3) may provide a comparator COM1 output that may remain logic high. This may keep boosted voltage signal VBUP high even after boosting control signal PREVBT returns low. This may keep oscillator circuit 7 enabled and booster circuit 8 may keep supplying charge to boosted potential VPP. A time delay ΔT4 after time t3, boosted potential VPP and word line potential Vw, may become above approximately 4.0 V. Thus, comparator COM1 output and boosted voltage signal may become low. This may disable oscillator circuit 7 and booster circuit 8 may stop supplying charge to boosted potential VPP.

Oscillator state latch circuit 7*c* may latch the logic state of oscillation signal VBOS and oscillator preset circuit 7*b* may preset oscillator circuit 7 to quickly change the logic state of oscillation signal VBOS when boosted voltage signal VBUP returns high again.

The embodiments may allow boosted potential VPP to receive charge before a charge-consuming event may deplete charge from a smoothing capacitor Cd. This may enable boosted potential VPP to better maintain a predetermined potential.

Thus, boosted potential detection circuit 60 may indicate if boosted potential VPP has dropped below a predetermined potential (approximately 4 volts when boosting control signal is logic low, as just one example) or if a word line is to be activated (boosting control signal PREVBT becomes high) boosted potential detection circuit 60 may indicate if boosted potential VPP has dropped below a higher predetermined potential (approximately 4.2 volts, as just one example). In this way, boosted potential detection circuit 60 may indicate that more charge may be supplied to boosted potential VPP.

Boosted potential VPP may be boosted in advance of a load (such as selecting a word line) being applied to boosted potential VPP.

It is noted that the higher predetermined potential of boosted potential VPP has been given, for example, to be approximately 4.2 Volts. The higher predetermined potential should not be limited to this value. If the predetermined potential of boosted potential VPP is set too low, problems similar to the conventional approach may occur. If the predetermined potential of boosted potential VPP is set too high, the memory cell transistor may suffer from breakdown due to stress. As such, resistance values of resistor devices (R2 and R3) may be selected accordingly.

A semiconductor memory device 50 may include a boosted potential detection circuit that may selectively function as either boosted potential detection circuit 6 or boosted potential detection circuit 60. In this case, if a boosted potential detection circuit 6 is desired, the gate of transistor Tr5 (FIG. 7) may be grounded and the gate of transistor Tr4 may be set at a high potential. This may be done through options such as metal options, fuses, or bond options, as just a few examples. However if, boosted potential detection circuit 60 is desired, the input to OR gate OR1 (FIG. 3) may be grounded and transistors (Tr4 and Tr5) may have gates connected as illustrated in FIG. 7.

As described above, a potential higher than that required for word line selection may be supplied in advance by previous boosting of a boosted potential VPP prior to the word line selection. This may reduce the adverse affects of charge depletion from a smoothing capacitor Cd that may store charge for boosted potential VPP and may improve the operating speeds of a semiconductor memory device 50. This may also allow a decreased size of a smoothing capacitor Cd and may decrease chip size.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:

a memory cell array having a plurality of word lines;

a word selection circuit that activates one of the plurality of word lines based on the value of an address;

a boosted potential coupled to the word selection circuit, the boosted potential providing charge to the activated word line; and a boosted potential generation circuit coupled to provide the boosted potential, the boosted potential generation circuit providing charge to the boosted potential when the word line is to be activated.

2. The semiconductor memory device according to claim 1, wherein:

the boosted potential generation circuit detects a command to activate a word line and provides charge to the boosted potential before the word line is activated.

3. The semiconductor memory device according to claim 2, wherein:

the command to activate a word line is a read command or a write command.

4. The semiconductor memory device according to claim 2, wherein:

the command to activate a word line is a refresh command.

5. The semiconductor memory device according to claim 1, wherein the boosted potential generation circuit includes:

an oscillator circuit coupled to generate an oscillation signal;

a booster circuit coupled to provide charge to the boosted potential in response to the oscillation signal;

a boosting control circuit coupled to provide a one-shot boosting control signal indicating that the word line is to be activated; and a boosted potential detection circuit coupled to receive the one-shot boosting control signal and provide a boosted voltage signal having an oscillator enable state and an oscillator disable state.

6. The semiconductor memory device according to claim 5, wherein:

the boosted voltage signal has the oscillator enable state when the one-shot boosting control signal indicates that the word line is to be activated; and the boosted voltage signal has the oscillator enable state when the boosted potential is lower than a predetermined potential.

7. The semiconductor memory device according to claim 5, wherein:

the boosted voltage signal has the oscillator enable state when the boosted potential is lower than a first predetermined potential when the one-shot boosting control signal does not indicate that the word line is to be activated;

the boosted voltage signal has the oscillator enable state when the boosted potential is lower than a second predetermined potential when the one-shot boosting control signal indicates that the word line is to be activated; and the second predetermined potential is greater than the first predetermined potential.

8. The semiconductor memory device according to claim 5, wherein:

the oscillator circuit includes an oscillating signal generator and an oscillator preset circuit;

the oscillating signal generator oscillates when the boosted voltage signal is in the oscillator enable state; and the oscillator preset circuit presets the oscillating signal generator to an opposite start state when the boosted voltage signal is in the oscillator disable state.

9. A control method for controlling a semiconductor memory device having a booster circuit that generates a boosted potential in response to an oscillation signal generated by an oscillator circuit, the method comprising the steps of:

receiving a command and an address;

decoding the command;

generating a boosting control signal in response to the decoded command indicating that a word line is to be activated;

providing charge to a boosted potential node in response to the boosting control signal; and providing an electrical connection between the boosted potential node and the word line in accordance with the value of the address received.

10. The control method according to claim 9, wherein:

the step of providing charge to the boosted potential node provides a boosted potential greater than an activation potential of the word line.

11. The control method according to claim 9, wherein:

the step of generating a boosting control signal includes generating a one-shot pulse.

12. The control method according to claim 9, wherein:

the step of providing charge to a boosted potential node includes generating the oscillation signal in response to the boosting control signal; and the oscillation signal has an oscillation signal period between transitions.

13. The control method according to claim 12, wherein:

generating the oscillation signal in response to the boosting control signal includes generating an oscillation control signal in response to the boosting control signal; and the oscillation signal has a last oscillation state when the oscillation control signal is in an oscillation disable state and the oscillation signal transitions to an opposite to last oscillation state when the oscillation control signal transitions to an oscillation enable state without being delayed by the oscillation signal period between transitions.

14. A semiconductor memory device, comprising:

a memory cell array having a plurality of word lines;

a word selection circuit that activates one of the plurality of word lines based on an address value;

a boosting control circuit coupled to generate a boosting control signal in response to a control signal indicating that a word line is to be activated;

a boosted potential detection circuit coupled to receive the boosting control signal and provide a boosted voltage signal having an oscillator enable state and an oscillator disable state;

a boosted potential node coupled to the word selection circuit, the boosted potential node providing charge to the activated word line;

an oscillation circuit coupled to generate an oscillation signal that has periodic logic transitions when the boosted voltage signal is in the oscillator enable state; and a booster circuit coupled to provide charge to the boosted potential node in response to logic transitions in the oscillation signal.

15. The semiconductor memory device according to claim 14, wherein:

the boosting control circuit generates the boosting control signal that is a one-shot pulse; and a command decoder is coupled to receive an externally applied command and generate the control signal.

16. The semiconductor memory device according to claim 14, wherein:

the boosted potential detection circuit includes a comparator that compares a reference potential and a boosted level indicating potential and generates the boosted voltage signal having an oscillator enable state when the reference potential is greater than the boosted level indicating potential.

17. The semiconductor memory device according to claim 14, wherein:

the boosting control circuit generates the boosting control signal having a first boosting control logic state when a word line is to be enabled; and the boosted potential detection circuit generates the boosted voltage signal having the oscillator enable state when the boosting control signal has the first boosting control logic state.

18. The semiconductor memory device according to claim 14, wherein the oscillation circuit includes:

an oscillation signal generator having a ring oscillator coupled to generate the oscillation signal having periodic logic transitions determined by a propagation delay of the ring oscillator;

an oscillator preset circuit that presets the oscillation circuit to trigger a first logic transition in the oscillation signal when the boosted voltage signal transitions from the oscillator disable state to the oscillator enable state; and the time from the boosted voltage signal transitioning from the oscillator disable state to the oscillator enable state to the first logic transition in the oscillation signal is less than the propagation delay of the ring oscillator.

19. The semiconductor memory device according to claim 18, wherein:

the oscillation circuit further includes a latch circuit for latching the state of the oscillation signal when the boosted voltage signal is in the oscillator disable state.

20. The semiconductor memory device according to claim 14, wherein the oscillation circuit includes:

a current source coupled to receive a reference potential and provide current from a power supply terminal to a ring oscillator; and the time delay between periodic logic transitions of the oscillation signal is dependent upon the reference potential.

* * * * *